US012130718B2

United States Patent
Mao et al.

(10) Patent No.: US 12,130,718 B2
(45) Date of Patent: Oct. 29, 2024

(54) SOC-ORIENTED CONCURRENT TEST SYSTEM FOR MULTIPLE CLOCK DOMAINS AND TEST METHOD THEREOF

(71) Applicant: Macrotest Semiconductor Inc., Nanjing (CN)

(72) Inventors: Guoliang Mao, Nanjing (CN); Zhijie Bao, Nanjing (CN)

(73) Assignee: Macrotest Semiconductor Inc., Nanjing (CN)

( * ) Notice: Subject to any disclaimer, the term of this patent is extended or adjusted under 35 U.S.C. 154(b) by 0 days.

(21) Appl. No.: 17/801,527

(22) PCT Filed: Apr. 18, 2022

(86) PCT No.: PCT/CN2022/087322
§ 371 (c)(1),
(2) Date: Jan. 5, 2023

(87) PCT Pub. No.: WO2023/273521
PCT Pub. Date: Jan. 5, 2023

(65) Prior Publication Data
US 2024/0220381 A1 Jul. 4, 2024

(30) Foreign Application Priority Data
Jul. 2, 2021 (CN) .......... 202110746890.0

(51) Int. Cl.
*G06F 11/273* (2006.01)
*G01R 31/317* (2006.01)

(52) U.S. Cl.
CPC .... *G06F 11/2733* (2013.01); *G01R 31/31727* (2013.01)

(58) Field of Classification Search
CPC .............. G06F 11/2733; G01R 31/31727
See application file for complete search history.

(56) References Cited

U.S. PATENT DOCUMENTS

| 10,656,203 | B1* | 5/2020 | Kishore | G01R 31/31727 |
| 2011/0251819 | A1* | 10/2011 | Ong | G01R 31/2889 702/120 |

(Continued)

*Primary Examiner* — Nadeem Iqbal
(74) *Attorney, Agent, or Firm* — Hemisphere Law, PLLC; Zhigang Ma

(57) ABSTRACT

The present disclosure relates to a System On Chip (SOC)-oriented concurrent test system and method for multiple clock domains, and belongs to the technical field of chip detection. A board system of the present disclosure includes a board, and a clock domain controller, a slot bus controller and a test subsystem which are arranged on the board; the clock domain controller is connected to the test subsystem and the slot bus controller; the slot bus controller is connected to a backplane bus; and the test subsystem includes a test processor and a signal processing unit; the test processor includes a test pattern memory, a memory control, a timing generator, a pattern generator and a command generator. In the present disclosure, by means of a concurrent test method for multiple clock domains, the test efficiency of a single SOC is improved, and the test cost of the single chip is also reduced, thus increasing the benefit. A higher coverage rate for detecting a failure of a chip that works in a concurrent working state of multiple modules is achieved, and the yield of chips after encapsulation is increased.

9 Claims, 3 Drawing Sheets

(56) References Cited

U.S. PATENT DOCUMENTS

2014/0218063 A1    8/2014   Roberts, Jr.
2015/0377943 A1   12/2015   Milner et al.
2017/0131346 A1    5/2017   Roberts, Jr.

* cited by examiner

SOC-ORIENTED CONCURRENT TEST SYSTEM FOR MULTIPLE CLOCK DOMAINS AND TEST METHOD THEREOF

TECHNICAL FIELD

The present disclosure relates to a System On Chip (SOC)-oriented concurrent test system and method for multiple clock domains, and belongs to the technical field of chip detection.

BACKGROUND

For test of an SOC, all functional modules can generally work concurrently. For example, while a Micro Control Unit (MCU) microprocessor processes data, a USB can send and receive data, and an internal memory can access data. In theory, if each internal module is tested at the same time, the test works in the same or different clock domains, so that the test can be completed concurrently at a high speed, and a working state closest to an actual use environment can be tested at a full speed.

Because of the characteristics of a mixed-signal SOC, there are a large number of requirements for synchronously testing digital and analog signals. However, since traditional signal processing units are all designed to work under the control of the same computer, and a computer bus can only read and write a certain signal processing unit at a time, only one test can be started during a pattern test. In this way, on the one hand, the test efficiency is low, and on the other hand, a test in a concurrent working state of multiple modules cannot be performed.

SUMMARY

The technical problem to be solved in the present disclosure is a lack of an effective detection method for an SOC in a concurrent working state. For the deficiencies in the prior art, an SOC-oriented concurrent test system for multiple clock domains and a test method thereof. A requirement for concurrent test in simulation of a concurrent working state of multiple functional modules in SOC test can be met.

In order to achieve the above-mentioned purpose, the technical solution adopted in this aspect is as follows: An SOC-oriented concurrent test system for multiple clock domains includes a system backplane, a backplane bus, a bus controller and a board system; a backplane slot is formed in the system backplane; the board system is mounted on the system backplane through the backplane slot; the backplane bus is arranged on the system backplane through a bus slot; the backplane bus achieves connection between the board systems; the system backplane is connected to a computer through the bus controller; the board system includes a board, and a clock domain controller, a slot bus controller and a test subsystem which are arranged on the board; the clock domain controller is connected to the test subsystem and the slot bus controller; the slot bus controller is connected to the backplane bus; the slot bus controller achieves data exchange and synchronization between the board systems on the backplane slot; the clock domain controller is in charge of time domain control of the test subsystem to achieve allocation and management of time domains of the test subsystem; the test subsystem includes a test processor and a signal processing unit; the test processor includes a test pattern memory, a memory control, a timing generator, a pattern generator and a command generator; the test pattern memory, the timing generator, the pattern generator and the command generator are respectively connected to the memory control; the timing generator, the pattern generator and the command generator are connected in sequence; the timing generator and the command generator are connected to the signal processing unit; the signal processing unit includes a digital unit, an analog unit and a mixing unit; the memory control and the signal processing unit are connected to the bus controller through the backplane bus; the computer realizes a function of generating a pattern file; the test pattern memory realizes a function of storing a code of the pattern file; the memory control is in charge of controlling the computer to download and read data of the test pattern memory; the storage memory is controlled by the test pattern generator to provide a function of in real time acquiring the pattern file; the timing generator realizes functions of generating, on the basis of a timing requirement specified by the pattern file, an accurate timing signal required by each cycle and providing the accurate timing signal to other modules of the test processor; the pattern generator realizes a function of generating a control timing on the basis of a command requirement of the pattern file, and realizes a function of controlling the memory control to access an address of the test pattern memory; functions of the control timing includes jump or circulation; the command generator realizes, on the basis of a command requirement of the pattern file, a function of generating a command signal used for synchronously controlling the signal processing unit; the command generator is controlled by the patter generator to send the command signal to the corresponding signal processing unit; and the signal processing unit executes an operation corresponding to the command signal according to the received command signal sent by the command generator.

In a further improvement of the above-mentioned technical solution, the bus controller includes an Auto Test Equipment (ATE) bus controller and a Peripheral Component Interface Express (PCIE) bus controller; the ATE bus controller achieves data exchange between the board system and the computer, and achieves synchronization between all the test subsystems; and the PCIE bus controller assists the ATE bus controller in achieving the data exchange between the board system and the computer.

In a further improvement of the above-mentioned technical solution, the backplane bus includes a data bus and a synchronization bus; the backplane bus achieves connection between the computer and the board system, enables the board system to be controlled by the computer, and achieves synchronization between all the board systems.

In a further improvement of the above-mentioned technical solution, the computer realizes a function of generating a pattern file.

In a further improvement of the above-mentioned technical solution, the signal processing unit includes a digital signal processing unit, an analog signal processing unit and a mixed signal processing unit; different signal processing units process different types of signals; and operations executed by the signal processing unit include output excitation and sampling for test.

In a further improvement of the above-mentioned technical solution, the memory control includes a Double Data Rate (DDR) memory control, a read-write controller and a data buffer.

An SOC-oriented concurrent test method for multiple clock domains applied to the SOC-oriented concurrent test system for multiple clock domains includes the following steps:

S1: before a test is started, determining a test requirement of a device under test corresponding to the test subsystem to be used, and generating a respective pattern file by the computer according to the test requirement;

S2: transmitting, by the computer through the bus controller, the pattern file corresponding to each test subsystem to be used to the test pattern memory;

S3, adjusting, by the computer according to the test requirement, configuration of each test subsystem to be used to adjust each test subsystem to be used to a state required by the test requirement;

S4: controlling, by the computer, the clock domain controller of each test subsystem to be used to control the timing generator to generate a timing signal, the timing signal being used as a clock domain corresponding to the test subsystem to be used;

S5: when the test is started, connecting the device under test to the signal processing unit by sorting equipment; and after receiving a test initiating signal, synchronously initiating, by the computer, each test subsystem to be used for testing;

S6: executing, by each test subsystem, the corresponding pattern file, and controlling the corresponding signal processing unit to complete excitation output of the device under test and acquisition and analysis of a return signal;

S7: acquiring, by the computer, a test result of each test subsystem, and comprehensively analyzing whether the test on the device under test succeeds;

S8: if the test succeeds, informing the sorting equipment to process the device under test as a qualified product; and if the test fails, informing the sorting equipment to process the device under test as a disqualified product.

In a further improvement of the above-mentioned technical solution, different types of devices to be tested are connected to different types of signal processing units including a digital signal processing unit, an analog signal processing unit and a mixed signal processing unit.

In a further improvement of the above-mentioned technical solution, the computer controls the clock domain controller of each test subsystem to be used according to the test requirement to enable the timing generator of each test subsystem to generate the same clock domain.

In a further improvement of the above-mentioned technical solution, the computer controls the clock domain controller of each test subsystem to be used according to the test requirement to enable the timing generator of each test subsystem to generate different clock domains.

The present disclosure has the beneficial effects below: The system and the method can fully meet the concurrent test requirement for multiple functional modules in the current SOC test, and solves the problem of low efficiency in the traditional method. By means of a concurrent test method for multiple clock domains, the test efficiency of a single SOC is improved, and the test cost of the single chip is also reduced; and by means of the concurrent test method for multiple clock domains, a higher coverage rate for detecting a failure of a chip that works in a concurrent working state of multiple modules can also be achieved, and the yield of chips is increased.

BRIEF DESCRIPTION OF THE DRAWINGS

The present disclosure is further described below in combination with accompanying drawings.

DETAILED DESCRIPTION OF THE EMBODIMENTS

Specific implementations of the present disclosure, such as mutual positions and connection relationships between the various parts involved, the functions and working principles of the various parts, and operation and use methods, will be described in further detail below in conjunction with the accompanying drawings by means of describing embodiments, so as to help those skilled in the art to have a more complete, accurate and deep understanding for the concept and technical solutions of the present disclosure.

EMBODIMENTS

Figure 1:
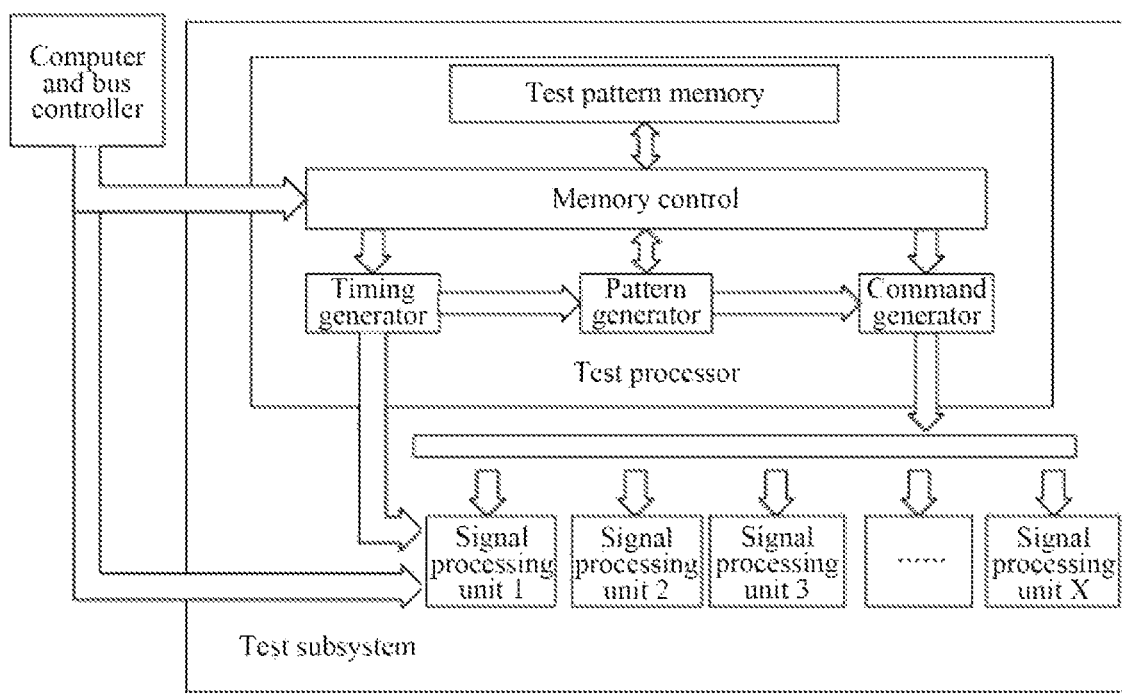
FIG. 1 is a schematic structural diagram of a test subsystem according to an embodiment of the present disclosure.
Figure 2:
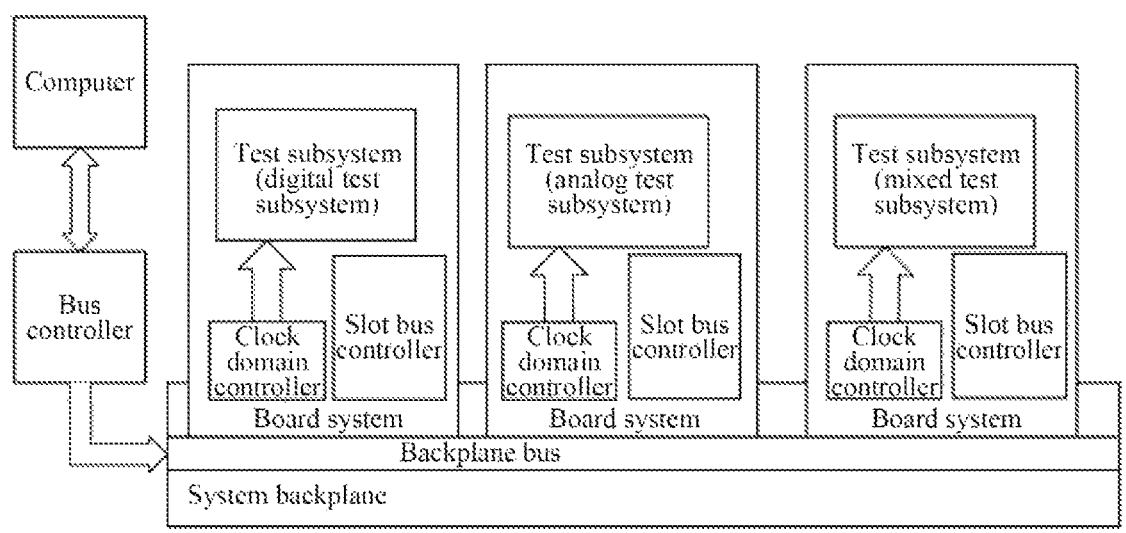
FIG. 2 is a schematic structural diagram of a test system according to an embodiment of the present disclosure.

As shown in FIG. 1 and FIG. 2, An SOC-oriented concurrent test system for multiple clock domains includes a system backplane, a backplane bus, a bus controller and a board system; a backplane slot is formed in the system backplane; the board system is mounted on the system backplane through the backplane slot; the backplane bus is arranged on the system backplane through a bus slot; the backplane bus achieves connection between the board systems; the system backplane is connected to a computer through the bus controller; the board system includes a board, and a clock domain controller, a slot bus controller and a test subsystem which are arranged on the board; the clock domain controller is connected to the test subsystem and the slot bus controller; the slot bus controller is connected to the backplane bus; the slot bus controller achieves data exchange and synchronization between the board systems on the backplane slot; the clock domain controller is in charge of time domain control of the test subsystem to achieve allocation and management of time domains of the test subsystem; the test subsystem includes a test processor and a signal processing unit; the test processor includes a test pattern memory, a memory control, a timing generator, a pattern generator and a command generator; the test pattern memory, the timing generator, the pattern generator and the command generator are respectively connected to the memory control; the timing generator, the pattern generator and the command generator are connected in sequence; the timing generator and the command generator are connected to the signal processing unit; the signal processing unit includes a digital unit, an analog unit and a mixing unit; the memory control and the signal processing unit are connected to the bus controller through the backplane bus; the computer realizes a function of generating a pattern file; the test pattern memory realizes a function of storing a code of the pattern file; the memory control is in charge of controlling the computer to download and read data of the test pattern memory; the storage memory is controlled by the test pattern generator to provide a function of in real time acquiring the pattern file; the timing generator realizes functions of generating, on the basis of a timing requirement specified by the pattern file, an accurate timing signal required by each cycle and providing the accurate timing signal to other modules of the test processor; the pattern generator realizes a function of generating a control timing on the basis of a command requirement of the pattern file, and realizes a function of controlling the memory control to access an address of the test pattern memory; functions of the control timing includes jump or circulation; the command generator realizes, on the basis of a command requirement of the pattern file, a function of generating a command signal used for synchronously controlling the signal processing unit; the command generator is controlled by the patter generator to send the command signal to the corresponding signal processing unit; and the signal processing unit executes an operation corresponding to the command signal according to the received command signal sent by the command generator.

The bus controller includes an Auto Test Equipment (ATE) bus controller and a Peripheral Component Interface Express (PCIE) bus controller; the ATE bus controller achieves data exchange between the board system and the computer, and achieves synchronization between all the test subsystems; and the PCIE bus controller assists the ATE bus controller in achieving the data exchange between the board system and the computer.

The backplane bus includes a data bus and a synchronization bus; the backplane bus achieves connection between the computer and the board system, enables the board system to be controlled by the computer, and achieves synchronization between all the board systems.

The computer realizes a function of generating a pattern file.

There may be a plurality of signal processing units according to a need, such as signal processing unit 1, signal processing unit 2, . . . , and signal processing unit X as shown in FIG. 1. The signal processing unit may include various types such as a digital signal processing unit, an analog signal processing unit and a mixed signal processing unit; different signal processing units process different types of signals: and operations executed by the signal processing unit include output excitation and sampling for test.

The digital signal processing unit is composed an anydigital-signal waveform generator, a Fail processor, a digital signal recorder, and the like. The digital signal processing unit acquires corresponding pattern control data according to a control command, generates a specified digital signal waveform, or compares a DUT output signal with a preset signal to form a Fail result. Meanwhile, the digital signal processing unit can be configured to record and debug a digital signal according to a requirement. Excitation and analysis of any digital signal can be achieved through the digital signal processing unit.

The analog signal processing unit is composed of a four-quadrant high-speed program control power supply, a command processor, a signal generator, a digitalizer and the like. The program control power supply and the signal generator are controlled through the command processor according to the control command to output any voltage or current. Meanwhile, a DUT signal is acquired and analyzed through the digitalizer, so that information such as DUT output voltage, current and waveform can be obtained for collection and analysis by the computer.

An SOC-oriented concurrent test method for multiple clock domains applied to the SOC-oriented concurrent test system for multiple clock domains includes the following steps:

S1: before a test is started, a test requirement of a device under test corresponding to the test subsystem to be used is determined, and the computer generates a respective pattern file according to the test requirement;

S2: the computer transmits, through the bus controller, the pattern file corresponding to each test subsystem to be used to the test pattern memory;

S3, the computer adjusts, according to the test requirement, configuration of each test subsystem to be used to adjust each test subsystem to be used to a state required by the test requirement;

S4: the computer controls the clock domain controller of each test subsystem to be used to control the timing generator to generate a timing signal, the timing signal being used as a clock domain corresponding to the test subsystem to be used;

S5: when the test is started, sorting equipment connects the device under test to the signal processing unit; and after receiving a test initiating signal, the computer synchronously initiates each test subsystem to be used for testing;

S6: each test subsystem executes the corresponding pattern file, and controls the corresponding signal processing unit to complete excitation output of the device under test and acquisition and analysis of a return signal;

S7: the computer acquires a test result of each test subsystem, and comprehensively analyzes whether the test on the device under test succeeds;

S8: if the test succeeds, the sorting equipment is informed to process the device under test as a qualified product; and if the test fails, the sorting equipment is informed to process the device under test as a disqualified product.

Different types of devices to be tested need to be connected to different types of signal processing units including a digital signal processing unit, an analog signal processing unit and a mixed signal processing unit.

The computer controls the clock domain controller of each test subsystem to be used according to the test requirement to enable the timing generator of each test subsystem to generate the same clock domain.

The computer controls the clock domain controller of each test subsystem to be used according to the test requirement to enable the timing generator of each test subsystem to generate different clock domains.

Figure 3:
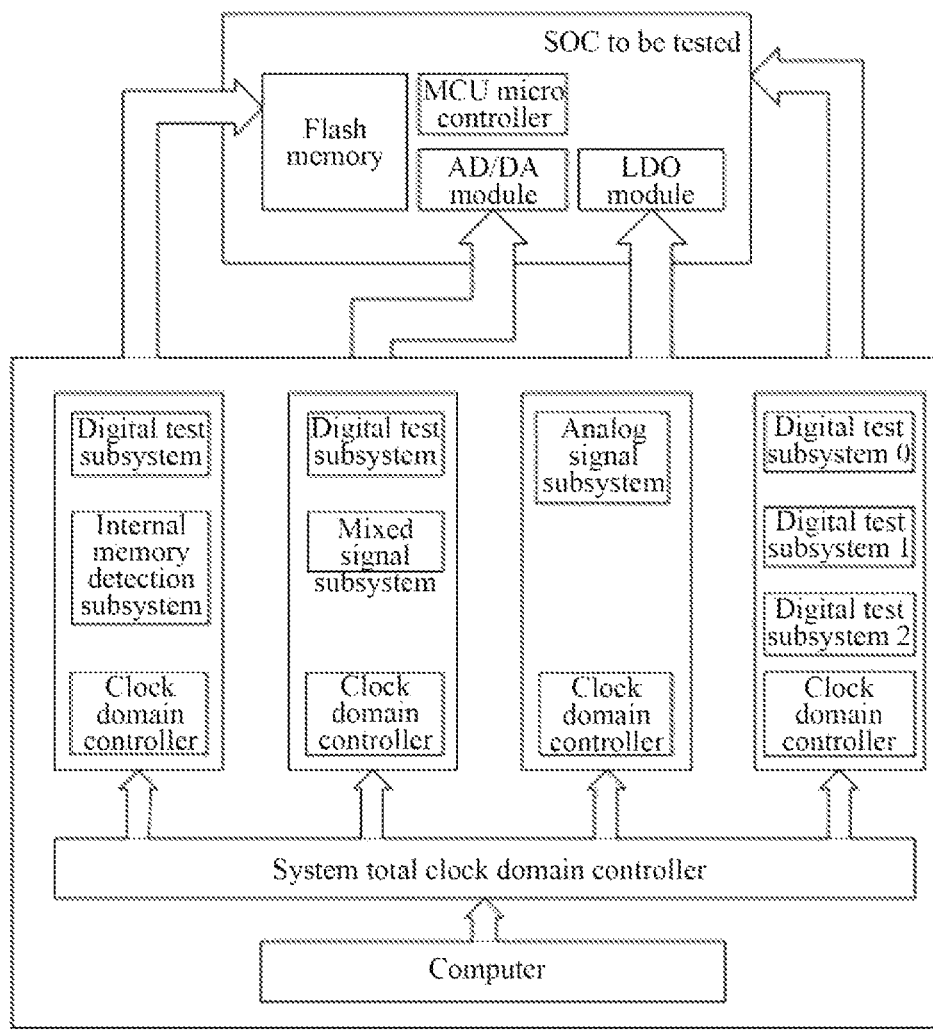
FIG. 3 is a state diagram of detection according to an embodiment of the present disclosure.

As shown in FIG. 3, functional modules of one typical SOC are required to be tested. The SOC internally includes four modules: a flash memory, an MCU micro controller, an AD/DA module and an LDO module. To complete the test on the four modules, four groups of test group resources are required to be allocated: test group 1, test group 2, test group 3, and test group 4.

Test group 1 includes one digital test subsystem and one internal memory test subsystem. The digital test subsystem uses a digital signal processing unit, and the internal memory test subsystem uses an internal memory signal processing unit, thus testing the flash memory.

Test group 2 includes one digital test subsystem and one mixed test subsystem. The digital test subsystem uses a digital signal processing unit, and the mixed test subsystem uses a mixed signal processing unit, thus testing the MCU micro controller and the AD/DA module.

Test group 3 includes one analog test subsystem which uses an analog signal test unit, thus testing the LDO module.

Test group 4 includes three digital test subsystems which use a digital signal processing units, thus testing a main controller of the SOC.

All the test subsystems of each test group are controlled by the same clock domain controller, and can be configured with the same clock domain. All the test subsystems in the clock domain work synchronously.

Different test groups are configured with different clock domains, and are controlled by a main clock controller of the system to asynchronously work. All the different clock domains form one clock domain group, and all the clock domains in each clock domain group can simultaneously initiate test. All the clock domains concurrently complete the test work of the respective test modules.

If the SOC is tested under the traditional condition of a single clock domain, the whole flow includes four steps: the flash memory, the MCU micro controller, the AD/DA module and the LDO module are tested in sequence to obtain test time points t1, t2, t3 and t4. A sum of the four test time points is total time T1: T1=t1+t2+t3+t4.

The test flow under the condition of multiple clock domains is divided into two steps: In the first step, the flash memory and the MCU micro controller are tested, and the AD/DA module is tested at the same time, thus respectively obtaining time points t1 and t2; and if t1 is greater than t2, the total time of test in the first step is t1. In the second step, the LDO module is tested to obtain time point t4; and a sum of the two time points is total time T2: T2=t1+t4. The test efficiency under multiple clock domains is obviously higher than that under a single clock domain.

The present disclosure is not limited to the above-mentioned embodiment. Any technical solutions formed by equivalent replacement all fall within the protection scope of the present disclosure.

What is claimed is:

1. A System On Chip (SOC)-oriented concurrent test system for multiple clock domains, wherein the system comprises a system backplane, a backplane bus, a bus controller and a board system; a backplane slot is formed in the system backplane; the board system is mounted on the system backplane through the backplane slot; the backplane bus is arranged on the system backplane through a bus slot; the backplane bus achieves connection between the board systems; the system backplane is connected to a computer through the bus controller; the board system comprises a board, and a clock domain controller, a slot bus controller and a test subsystem which are arranged on the board; the clock domain controller is connected to the test subsystem and the slot bus controller; the slot bus controller is connected to the backplane bus; the slot bus controller achieves data exchange and synchronization between the board systems on the backplane slot; the clock domain controller is in charge of time domain control of the test subsystem to achieve allocation and management of time domains of the test subsystem; the test subsystem comprises a test processor and a signal processing unit; the test processor comprises a test pattern memory, a memory control, a timing generator, a pattern generator and a command generator; the test pattern memory, the timing generator, the pattern generator and the command generator are respectively connected to the memory control; the timing generator, the pattern generator and the command generator are connected in sequence; the timing generator and the command generator are connected to the signal processing unit; the signal processing unit comprises a digital unit, an analog unit and a mixing unit; the memory control and the signal processing unit are connected to the bus controller through the backplane bus; the computer realizes a function of generating a pattern file; the test pattern memory realizes a function of storing a code of the pattern file; the memory control is in charge of controlling the computer to download and read data of the test pattern memory; the memory control is controlled by the pattern generator to provide a function of in real time acquiring the pattern file; the timing generator realizes functions of generating, on the basis of a timing requirement specified by the pattern file, an accurate timing signal required by each cycle and providing the accurate timing signal to other modules of the test processor; the pattern generator realizes a function of generating a control timing on the basis of a command requirement of the pattern file, and realizes a function of controlling the memory control to access an address of the test pattern memory; functions of the control timing comprises jump or circulation; the command generator realizes, on the basis of a command requirement of the pattern file, a function of generating a command signal used for synchronously controlling the signal processing unit; the command generator is controlled by the pattern generator to send the command signal to the corresponding signal processing unit; and the signal processing unit executes an operation corresponding to the command signal according to the received command signal sent by the command generator.

2. The SOC-oriented concurrent test system for the multiple clock domains according to claim 1, wherein the bus controller comprises an Auto Test Equipment (ATE) bus controller and a Peripheral Component Interface Express (PCIE) bus controller; the ATE bus controller achieves data exchange between the board system and the computer, and achieves synchronization between all the test subsystems; and the PCIE bus controller assists the ATE bus controller in achieving the data exchange between the board system and the computer.

3. The SOC-oriented concurrent test system for the multiple clock domains according to claim 1, wherein the backplane bus comprises a data bus and a synchronization bus; the backplane bus achieves connection between the computer and the board system, enables the board system to be controlled by the computer, and achieves synchronization between all the board systems.

4. The SOC-oriented concurrent test system for the multiple clock domains according to claim 1, wherein the signal processing unit comprises a digital signal processing unit, an analog signal processing unit and a mixed signal processing unit; different signal processing units process different types of signals; and operations executed by the signal processing unit comprise output excitation and sampling for test.

5. The SOC-oriented concurrent test system for the multiple clock domains according to claim 1, wherein the memory control comprises a Double Data Rate (DDR) memory control, a read-write controller and a data buffer.

6. An SOC-oriented concurrent test method for multiple clock domains applied to the SOC-oriented concurrent test system for multiple clock domains according to any one of claims 1 to 5, wherein the method comprises the following steps:

S1: before a test is started, determining a test requirement of a device under test corresponding to the test subsystem to be used, and generating a respective pattern file by the computer according to the test requirement;

S2: transmitting, by the computer through the bus controller, the pattern file corresponding to each test subsystem to be used to the test pattern memory;

S3: adjusting, by the computer according to the test requirement, configuration of each test subsystem to be used to adjust each test subsystem to be used to a state required by the test requirement;

S4: controlling, by the computer, each clock domain controller to be used to control the timing generator to generate a timing signal, the timing signal being used as a clock domain corresponding to the test subsystem to be used;

S5: when the test is started, connecting the device under test to the signal processing unit; and after receiving a test initiating signal, synchronously initiating, by the computer, each test subsystem to be used for testing;

S6: executing, by each test subsystem, the corresponding pattern file, and controlling the corresponding signal processing unit to complete excitation output of the device under test and acquisition and analysis of a return signal;

S7: acquiring, by the computer, a test result of each test subsystem, and comprehensively analyzing whether the test on the device under test succeeds;

S8: if the test succeeds, determining the device under test as a qualified product; and if the test fails, determining the device under test as a disqualified product.

7. The SOC-oriented concurrent test method for the multiple clock domains according to claim 6, wherein different types of devices to be tested are connected to different types of signal processing units comprising a digital signal processing unit, an analog signal processing unit and a mixed signal processing unit.

8. The SOC-oriented concurrent test method for the multiple clock domains according to claim 6, wherein the computer controls each clock domain controller to be used according to the test requirement to enable each timing generator to generate the same clock domain.

9. The SOC-oriented concurrent test method for the multiple clock domains according to claim 6, wherein the computer controls each clock domain controller to be used according to the test requirement to enable each timing generator to generate different clock domains.

\* \* \* \* \*